United States Patent
Le Bars et al.

(10) Patent No.: US 7,424,070 B2
(45) Date of Patent: Sep. 9, 2008

(54) METHOD AND DEVICE FOR EVALUATING THE NOISE ASSOCIATED WITH TURBOCODES, AND SYSTEMS USING THEM

(75) Inventors: Philippe A. Le Bars, Thorigne-Fouillard (FR); Frederique Ehrmann, Rennes (FR); Francois Thoumy, Vignoc (FR); Lionel Le Scolan, Rennes (FR); Samuel Rousselin, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 429 days.

(21) Appl. No.: 11/116,324

(22) Filed: Apr. 28, 2005

(65) Prior Publication Data

US 2005/0185735 A1    Aug. 25, 2005

Related U.S. Application Data

(62) Division of application No. 09/805,176, filed on Mar. 14, 2001, now Pat. No. 6,898,251.

(30) Foreign Application Priority Data

Apr. 4, 2000    (FR)    .................................. 00 04280

(51) Int. Cl.
*H03D 1/00*      (2006.01)
*H03M 13/03*      (2006.01)

(52) U.S. Cl. ....................... 375/340; 375/341; 375/295; 375/296; 714/786

(58) Field of Classification Search ......... 375/295–296, 375/340–341; 714/752, 786, 751
See application file for complete search history.

(56) References Cited

U.S. PATENT DOCUMENTS 5,446,747 A    8/1995    Berrou ........................ 371/45

(Continued)

OTHER PUBLICATIONS

Wang, C.C.: "On the Optimization of Channel Side Information for Turbo Decoding", 2000 IEEE Aerospace Conference, Proceedings (Cat. No. 00SH848), 2000 IEEE Aerospace Conference Proceedings, Big Sky, MT. USA, Mar. 18-25, 2000, pp. 311-315, vol. 1.

(Continued)

*Primary Examiner*—Chieh M. Fan
*Assistant Examiner*—Jason M. Perilla
(74) *Attorney, Agent, or Firm*—Fitzpatrick, Cella, Harper & Scinto

(57) ABSTRACT

In order to evaluate the noise related to data issuing from a turbo-encoder, estimates of the noise related to its systematic output, to the data issuing from its first elementary encoder, and to the data issuing from its second elementary encoder are determined. At least two of the estimates of the noise related to the systematic output, to the data issuing from the first encoder, and to the data issuing from the second encoder, are added. The results of these additions are divided by the number of augends added, and then inverted, so as to obtain a noise factor, and the noise factor is multiplied with the data issuing from at least one of the first encoder, second encoder, and systematic output.

9 Claims, 5 Drawing Sheets

U.S. PATENT DOCUMENTS

| | | | | |
|---|---|---|---|---|
| 5,944,850 | A | | 8/1999 | Chouly et al. .............. 714/790 |
| 6,023,783 | A | | 2/2000 | Divsalar et al. ............ 714/792 |
| 6,028,897 | A | * | 2/2000 | Wang ........................ 375/265 |
| 6,289,486 | B1 | * | 9/2001 | Lee et al. ................... 714/788 |
| 6,360,345 | B1 | * | 3/2002 | Kim et al. .................. 714/746 |
| 6,625,762 | B1 | * | 9/2003 | Le Dantec ................. 714/701 |
| 6,801,588 | B1 | * | 10/2004 | Yamaguchi ................ 375/341 |

OTHER PUBLICATIONS

Summers, T. A. et al: "SNR Mismatch and Online Estimation in Turbo Decoding", IEEE Transactions on Communications, Apr. 1998, IEEE, USA, vol. 46, No. 4, pp. 421-423.

Huang, X. et al: "Turbo Decoders Which Adapt to Noise Distribution Mismatch", IEEE Communications Letters, IEEE Service Center, Piscataway, US, US, vol. 2, No. 12, Jan. 1999, pp. 321-323.

Berru, C. et al., *Near Shannon Limit Error—Correcting Coding and Decoding: Turbo-Codes* (1), IEEE (1993), pp. 1064-1070.

* cited by examiner

METHOD AND DEVICE FOR EVALUATING THE NOISE ASSOCIATED WITH TURBOCODES, AND SYSTEMS USING THEM

RELATED APPLICATION

This application is a divisional of application Ser. No. 09/805,176, filed Mar. 14, 2001, the entire contents of which are incorporated herein by reference.

BACKGROUND OF THE INVENTION

1. Field of the Invention

The present invention relates to a method and device for evaluating the noise associated with turbocodes, and to systems using them.

2. Related Art

Turbocodes are very advantageous in conditions of low signal to noise ratios (SNRs). A conventional turbo-encoder consists of two recursive systematic convolutional (RSC) encoders and an interleaver, disposed as shown in FIG. 1. The turbo-encoder supplies as an output three series of binary elements (x, y1, y2), where x is the so-called systematic output of the turbo-encoder, that is to say one which has not undergone any processing with respect to the input signal x, y1 is the output encoded by the first RSC encoder, and y2 is the output encoded by the second RSC encoder after passing through the interleaver.

For more details on turbocodes, reference could usefully be made to the article by C. Berrou, A. Glavieux and P. Thitimajshima entitled "*Near Shannon limit error-correcting coding and decoding: turbo-codes*", ICC '93, Geneva.

FIG. 2 depicts an example of a conventional turbo-decoder able to decode data supplied by a turbo-encoder like the one in FIG. 1. The inputs x', y1', y2' of the turbodecoder are the outputs of the turbo-encoder altered by the transmission channel and the transmission and reception processes. The structure of such a turbodecoder is well known to persons skilled in the art and will therefore not be described in detail here.

It requires in particular two decoders, referred to as "Decoder 1" and "Decoder 2" in FIG. 2, for example of the BCJR type, that is to say using the Bahl, Cocke, Jelinek and Raviv algorithm, or of the SOVA ("Soft Output Viterbi Algorithm") type. The data supplied as an input to the decoders 1 and 2 take into account the signal to noise ratio.

A conventional turbodecoder also requires a looping back of the output of the deinterleaver π2 onto the input of the first decoder, in order to transmit the so-called "extrinsic" information from the second decoder to the first decoder.

It can be shown that the result of the decoding depends on the noise impairing the transmission channel as well as the transmission and reception processes.

In a theoretical study or during a simulation, the "noise" parameter is generally a given in the problem.

On the other hand, in an application to the real world, the noise is a characteristic related to the channel and can vary from one data transmission to another, or even during the same data transmission. In fact, it is possible to know only approximate statistics of the noise.

In the case of turbocodes, the decoding system can work with a highly incorrect noise estimation; nevertheless, its ability to correct the errors which have been introduced by the channel noise will be decreased. In this case, the encoding cost, which is the redundancy of the data, is high compared with the gain in performance and makes the system inadequate.

Different techniques are known for effecting a statistical evaluation of the noise.

For example, since the appearance of data transmission modems, the possibility has been known of using the constellation of the signal for establishing statistics of the noise. Thus, when the points transmitted are coded in accordance with an NRZ (Non-Return to Zero) modulation, the original symbols belong to a set {−1; +1}. It is assumed that the symbols received have undergone a white Gaussian noise addition; they are therefore distributed in accordance with a distribution illustrated in FIG. 3.

It is then possible to extract an estimation of the noise which, in the case illustrated in FIG. 3, corresponds to the standard deviation of the symbols received with respect to a mean centred on the position of the symbols sent. It should be noted that the centring on the theoretical symbols is a consequence of using a white Gaussian noise.

During an actual transmission, the assumption according to which the noise on the channel is Gaussian is ah approximation. It is however possible to obtain an estimation of the noise by accumulating the measurements of the deviations of each symbol received with respect to a theoretical symbol situated at the shortest distance from this received symbol, and then dividing this accumulation by the total number of symbols received. Here a maximum likelihood criterion is applied, which assimilates a received symbol to its closest neighbour. Thus the evaluation of the noise B on a modulation, whether it is plotted on the Fresnel plane with one or two dimensions, is effected by means of the following operation:

$$B = \frac{\sum_{i=1}^{N} \min_i [(\bullet - S_i)^2]}{N}$$

where i is an integer, N designates the number of symbols per frame or block, "min" designates the smallest Euclidian distance between a received symbol and the theoretical points of the constellation, the sign • designates the position of the received symbols and $S_i$ designates the positions of the theoretical symbols.

This technique is known notably in the field of modems, where it is used for obtaining a negotiation of the bit rate per symbol as a function of the state of the channel.

However, this solution has the drawback of introducing an inaccuracy, since the noise suffered by the original symbol can be such that the received symbol is situated at a smaller distance from a theoretical symbol different from the original symbol than the original symbol itself.

SUMMARY OF THE INVENTION

It will be understood that, the higher the signal to noise ratio, the more accurate is the estimation described in this solution. Likewise, the greater the number of symbols on which the noise is evaluated, the more exact are the statistics.

From this viewpoint, the invention aims to evaluate the noise on an estimator having an identical structure for all the symbols, whether they represent the systematic data item or any one of the parity data. The invention also proposes a method of evaluating the noise adapted to the turbodecoder which, although going counter to the accuracy of the statistics, makes it possible to improve the performance of the decoder.

Thus the present invention proposes a method of evaluating the noise related to data streams issuing from a turbo-encoder having at least first and second encoders, these data streams being intended for a turbodecoder having at least first and second elementary decoders, according to which:

an operation of estimating the noise is performed, consisting of determining an estimate of the noise related to the systematic output of the turbo-encoder, an estimate of the noise related to the data stream issuing from the first encoder and an estimate of the noise related to the data stream issuing from the second encoder;

this method being remarkable in that it also includes steps according to which the following operations are performed:

an addition operation of adding at least two of the estimate of the noise related to the systematic output, the estimate of the noise related to the data stream issuing from the first encoder, and the estimate of the noise related to the data stream issuing from the second encoder;

a division operation of dividing the result of the addition operation by the number of augends added in the addition operation;

an inversion operation of determining the inverse of the result of the division operation as a noise factor; and a multiplication operation of multiplying the noise factor with the data stream issuing from at least one of the first encoder, second encoder and systematic output.

The present invention thus makes it possible to establish statistics of the noise adapted to the structure of the turbodecoder, which makes it possible to improve the performance in terms of bit error rate (BER).

The invention can be implemented both on signal processors and on FPGAs ("Field Programmable Gate Arrays"), that is to say by means of hard-wired or programmed logic.

According to a particular characteristic, in the addition operation, the estimate of the noise related to the systematic output, the estimate of the noise related to the data stream issuing from the first encoder, and the estimate of the noise related to the data stream issuing from the second encoder are added, in said division operation, the result of the addition operation is divided by three, and in said multiplication operation, the noise factor is multiplied with each of the data streams issuing from the first encoder, second encoder, and systematic output.

According to a particular characteristic, the addition operation comprises a first and second addition operations, the first addition operation consisting of adding the estimate of the noise related to the systematic output and the estimate of the noise related to the data stream issuing from the first encoder, and the second addition operation consisting of adding the estimate of the noise related to the systematic output and the estimate of the noise related to the data stream issuing from the second encoder, the division operation comprises a first and second division operations, the first division operation consisting of dividing by two the result of the first addition operation, and second division operation consisting of dividing by two the result of the second addition operation, in the inversion operation, the inverse of the results of the first and second division operations are determined as first and second noise factors, respectively, and the multiplication operation comprises a first, second, third and fourth multiplication operations, the first multiplication operation consisting of multiplying the data stream issuing from the first encoder by the first noise factor, the second multiplication operation consisting of multiplying the data stream issuing from the systematic output and intended for the first elementary turbodecoder by the first noise factor, the third multiplication operation consisting of multiplying the data streams issuing from the second encoder by the second noise factor, and the fourth multiplication operation consisting of multiplying the data streams issuing from the systematic output and intended for the second elementary turbodecoder by the second noise factor.

According to a particular characteristic, during the noise estimation operation, the moving average of the sum of the Euclidian distances from each noisy symbol received to the closest theoretical symbol is determined, respectively for each symbol of the data stream issuing from the systematic output, for each symbol of the data stream issuing from the first encoder and for each symbol of the data stream issuing from the second encoder.

This characteristic makes it possible to improve the decoding performances of the turbodecoder by the use of an evaluation of the noise resulting from a statistical measurement of the deviation of the symbols received during a transmission with respect to the theoretical symbols, on the basis of a decision on the maximum likelihood.

It constitutes an inexpensive means of evaluating the noise, easy to implement on hard-wired or programmed logic circuits, or during a calculation program on a digital signal processor (DSP) or a microprocessor.

According to a particular characteristic, in order to determine the moving average mentioned above, a comparison operation is performed, consisting of determining to which Voronoï region each noisy symbol received belongs.

It would be possible, as a variant, to calculate the Euclidian distances between the received symbol and each of the theoretical points, and then to choose the smallest of the distances. However, calculating the Euclidian distances entails the calculation of a squared quantity, as well as subtractions. The above particular characteristic has the advantage that the Voronoï regions are defined easily and the comparison operation makes it possible to reduce the number of operations to be performed.

According to a particular characteristic, the method of the invention also includes a step according to which:

a delay application operation is performed, consisting of applying a delay to the data streams issuing from the systematic output and the first and second encoders, prior to the multiplication operations.

This characteristic makes it possible to terminate the estimation of the noise before commencing decoding proper.

According to a particular characteristic, the first and second encoders are recursive systematic convolutional encoders.

For the same purpose as that indicated above, the present invention also proposes a device for evaluating the noise related to data streams issuing from a turbo-encoder having at least first and second encoders, these data streams being intended for a turbodecoder having at least first and second elementary decoders, this device having:

a noise estimation module, for determining an estimate of the noise related to the systematic output of the turbo-encoder, an estimate of the noise related to the data stream issuing from the first encoder and an estimate of the noise related to the data stream issuing from the second encoder; this device being remarkable in that it also has:

addition modules, for adding at least two of the estimate of the noise related to the systematic output, the estimate of the noise related to the data stream issuing from the first encoder, and the estimate of the noise related to the data stream issuing from the second encoder;

division modules, for dividing the result supplied by the addition modules by the number of augends added by the addition modules;

inversion modules, for determining the inverse of the result supplied by the division modules as a noise factor; and multiplication modules, for multiplying the noise factor with the data stream issuing from at least one of the first encoder, second encoder and systematic output.

The present invention also relates to a digital signal processing apparatus, having means adapted to implement a method as above.

The present invention also relates to a digital signal processing apparatus, having a device as above.

The present invention also relates to a telecommunications network, having means adapted to implement a method as above.

The present invention also relates to a telecommunications network, having a device as above.

The present invention also relates to a mobile station in a telecommunications network, having means adapted to implement a method as above.

The present invention also relates to a mobile station in a telecommunications network, having a device as above.

The invention also relates to:

an information storage means which can be read by a computer or microprocessor storing instructions of a computer program, enabling a method as above to be implemented, and an information storage means which is removable, partially or totally, and which can be read by a computer or microprocessor storing instructions of a computer program, making it possible to implement a method as above.

The invention also relates to a computer program product comprising software code portions for implementing a method as above.

The particular characteristics and advantages of the noise evaluation device, the different digital signal processing apparatus, the different telecommunications networks, the different mobile stations, the information storage means and the computer program product being similar to those of the noise evaluation method according to the invention, these particular characteristics and advantages are not repeated here.

BRIEF DESCRIPTION OF THE DRAWINGS

Other aspects and advantages of the invention will emerge from a reading of the following detailed description of particular embodiments, given by way of non-limitative examples. The description refers to the drawings which accompany it, in which.

DETAILED DESCRIPTION OF THE PREFERRED EMBODIMENTS

Figure 4:
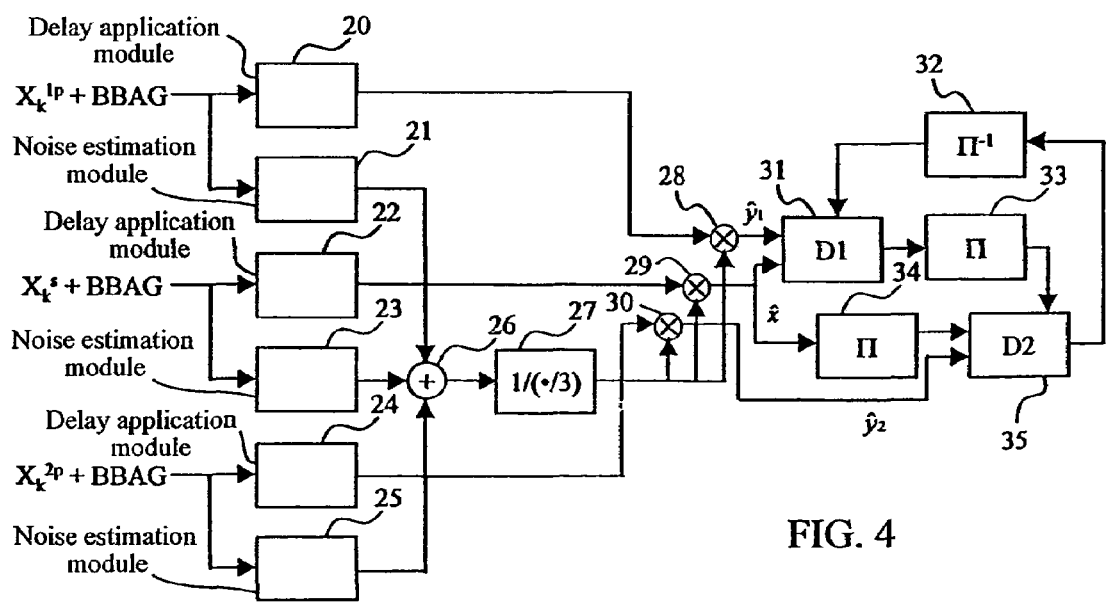
FIG. 4 depicts schematically a noise evaluation device in a first embodiment.

In the application of the noise evaluation to turbocodes, it is possible to apply the prior art described in the introduction to the construction of a decoder including a noise evaluation device like the one illustrated in FIG. 4.

This noise evaluation device includes a module 23 for estimating the noise related to the systematic output $X_k^s$ of the turbo-encoder (the notation "+BBAG" designating the white additive Gaussian noise affecting the data), a module 21 for estimating the noise related to the data stream $X_k^{1p}$ issuing from the first recursive systematic convolutional encoder included in the turbo-encoder and a module 25 for estimating the noise related to the data stream $X_k^{2p}$ issuing from the second recursive systematic convolutional encoder included in the turbo-encoder. Such noise estimation modules are detailed later in relation to FIG. 7. The symbols issuing from the three outputs of the turbo-encoder being presented by blocks, the noise estimation modules 23, 21 and 25 supply an estimation of the noise over the length of each block.

Delay application modules 22, 20 and 24 are also provided in parallel to the noise estimation modules 23, 21 and 25, on each of the three outputs of the turbo-encoder. The modules 22, 20 and 24 make it possible to know the result of the estimation of the noise on each output before applying a multiplying factor, taking this noise into account, to the first symbol issuing from each output and intended for the turbodecoder.

An adder 26 adds the result of the three noise estimations supplied by the modules 23, 21 and 25, and a module 27 divides the sum obtained by 3 and then calculates the inverse of the result of this division.

The module 27 thus supplies a normalisation factor, which is applied by multiplication firstly to the first-parity data stream, that is to say the one issuing from the first encoder, by means of a multiplier 28, secondly to the systematic data stream, by means of a multiplier 29, and finally to the second-parity data stream, that is to say the one issuing from the second encoder, by means of a multiplier 30.

Figure 1:
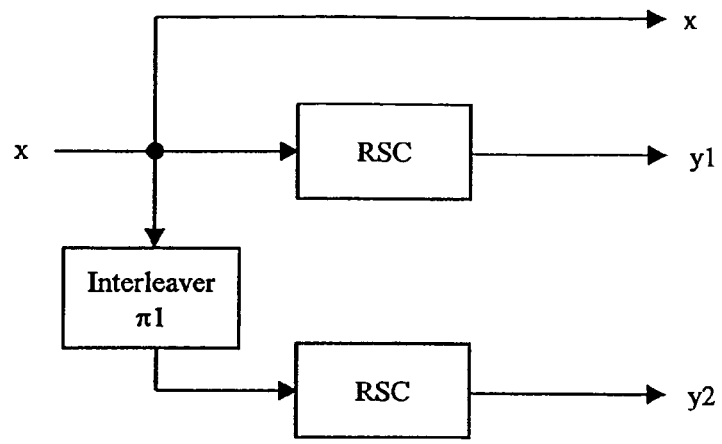
FIG. 1, already described, depicts schematically the structure of a conventional turbo-encoder.
Figure 2:
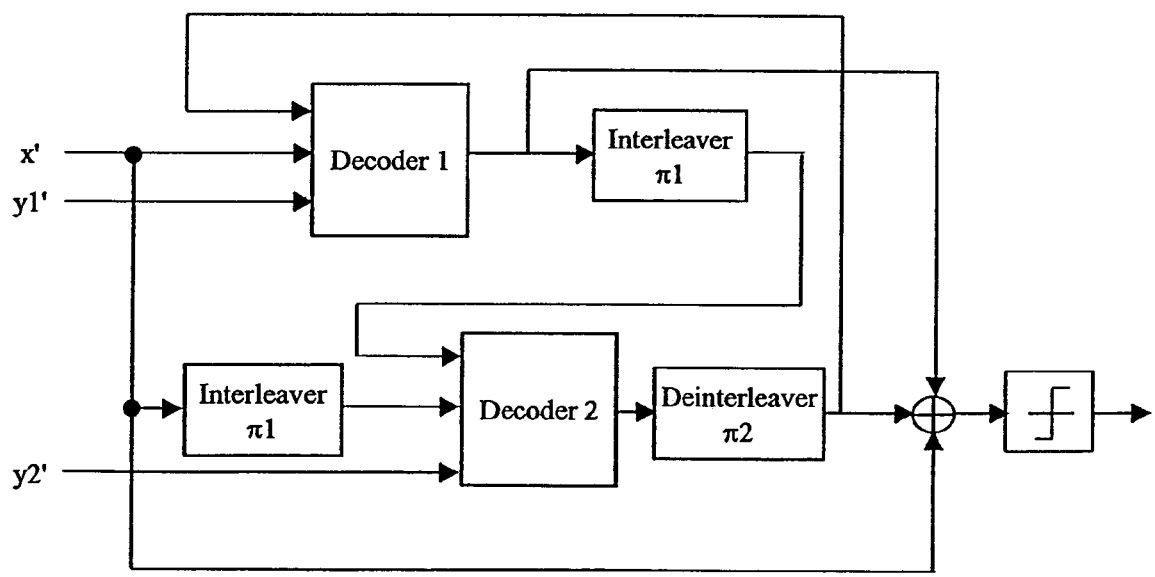
FIG. 2, already described, depicts schematically the structure of a conventional turbodecoder.
Figure 3:
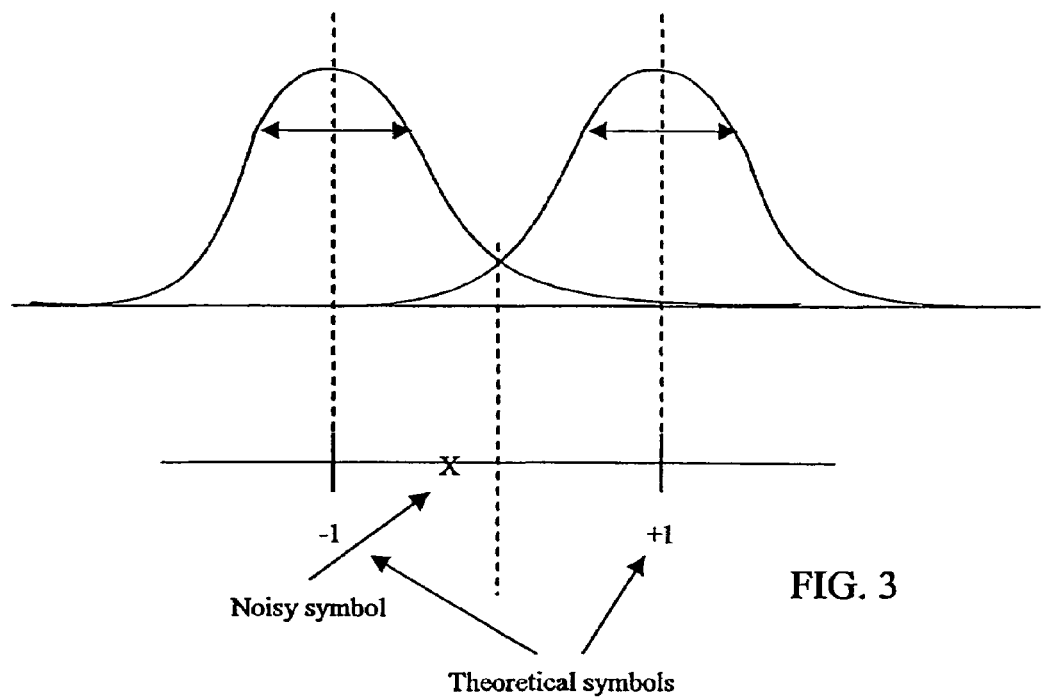
FIG. 3, already described, illustrates schematically the distribution of the received symbols which have undergone a white Gaussian noise addition, the symbols sent being encoded in NRZ (Non-Return to Zero)

The elements 31 to 35 form a conventional turbodecoder similar to that of FIG. 2, having interleavers 33 and 34, a deinterleaver 32 and two elementary decoders 31 and 35 applying, for example, the BCJR algorithm as stated in the introduction.

Figure 5:
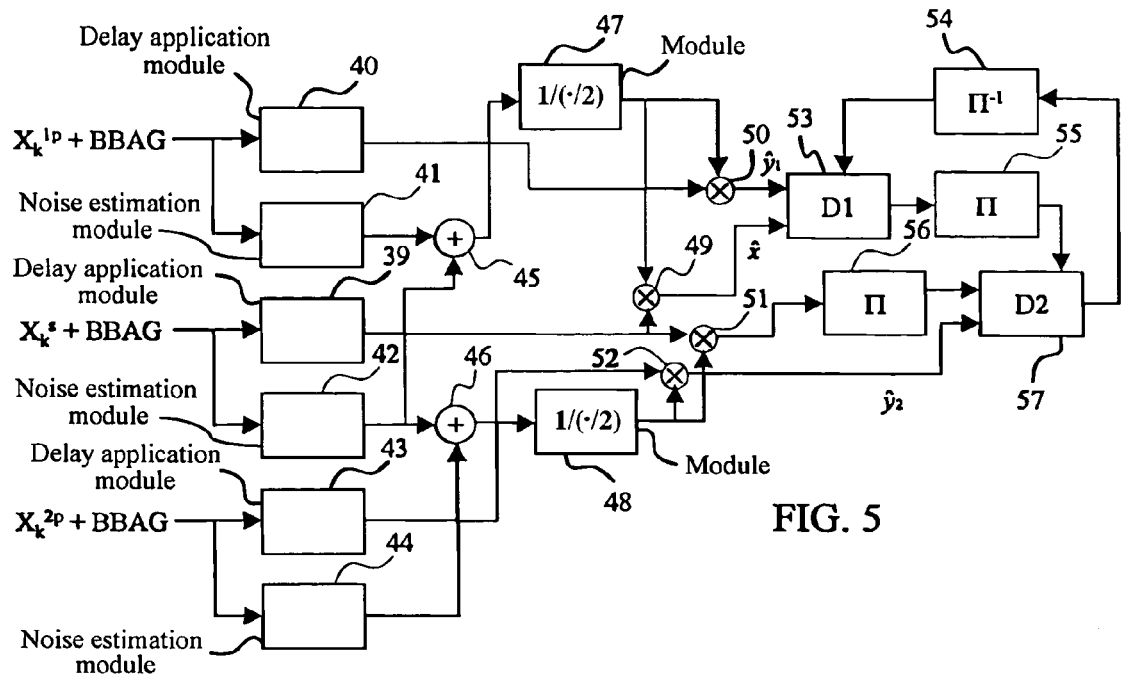
FIG. 5 depicts schematically a noise evaluation device according to the present invention, in another embodiment, adapted to the structure of the turbo-encoder.

FIG. 5 illustrates a preferred embodiment of the noise evaluation device according to the invention, more in accordance than the previous one with the structure of the turbodecoder and making it possible to obtain a better performance.

In this embodiment, the three noise estimations are not added together, but in pairs.

The noise evaluation device in FIG. 5 has, as in the embodiment described before, a module 42 for estimating the noise related to the noisy systematic output $X_k^s$+BBAG of the turbo-encoder, a module 41 for estimating the noise related to the noisy data stream issuing from the recursive systematic convolutional encoder $X_k^{1p}$+BBAG and a module 44 for estimating the noise related to the noisy data stream issuing from the second recursive systematic convolutional encoder $X_k^{2p}$+BBAG.

The noise evaluation device also has, as in the previous embodiment, three delay application modules 39, 40 and 43, disposed respectively in parallel to the noise estimation modules 42, 41 and 44.

On the other hand, unlike the previous embodiment, the noise evaluation device of FIG. 5 has not one but two adders 45 and 46, disposed as follows: the adder 45 adds the results of the estimation of the noises suffered by the systematic data stream and the first-parity data stream, whilst the adder 46 adds the results of the estimation of the noises suffered by the systematic data stream and the second-parity data stream.

A module 47 effects the division by 2, and then the inversion of the result supplied by the adder 45, so as to supply as an output the first normalisation factor or first noise factor. Likewise, a module 48 effects the division by 2, and then the inversion of the result supplied by the adder 46, so as to supply as an output a second normalisation factor or second noise factor.

The first noise factor is applied by multiplication to the first-parity data stream, by means of a multiplier 50, and to the systematic data stream intended for the first elementary decoder 53 of the turbodecoder, by means of a multiplier 49.

In a similar fashion, the second noise factor is applied by multiplication to the second-parity data stream, by means of a multiplier 52, and to the systematic data stream intended for the second elementary decoder 57 of the turbodecoder, by means of a multiplier 51.

As in the previous embodiment, the elements 53 to 57 form a conventional turbodecoder similar to that of FIG. 2, having interleavers 55 and 56, a deinterleaver 54 and two elementary decoders 53 and 57 applying, for example, the BCJR algorithm as stated in the introduction. In particular, the first elementary decoder 53 applies a decoding in accordance with the trellis used in the first recursive systematic convolutional encoder of the turbo-encoder, and the second elementary decoder 57 applies a decoding in accordance with the trellis used in the second recursive systematic convolutional encoder of the turbo-encoder.

This embodiment, adapted to the structure of the turbo-encoder, makes it possible to obtain an improvement of more than 7% in the performance in terms of bit error rate compared with the signal to noise ratio.

Figure 7:
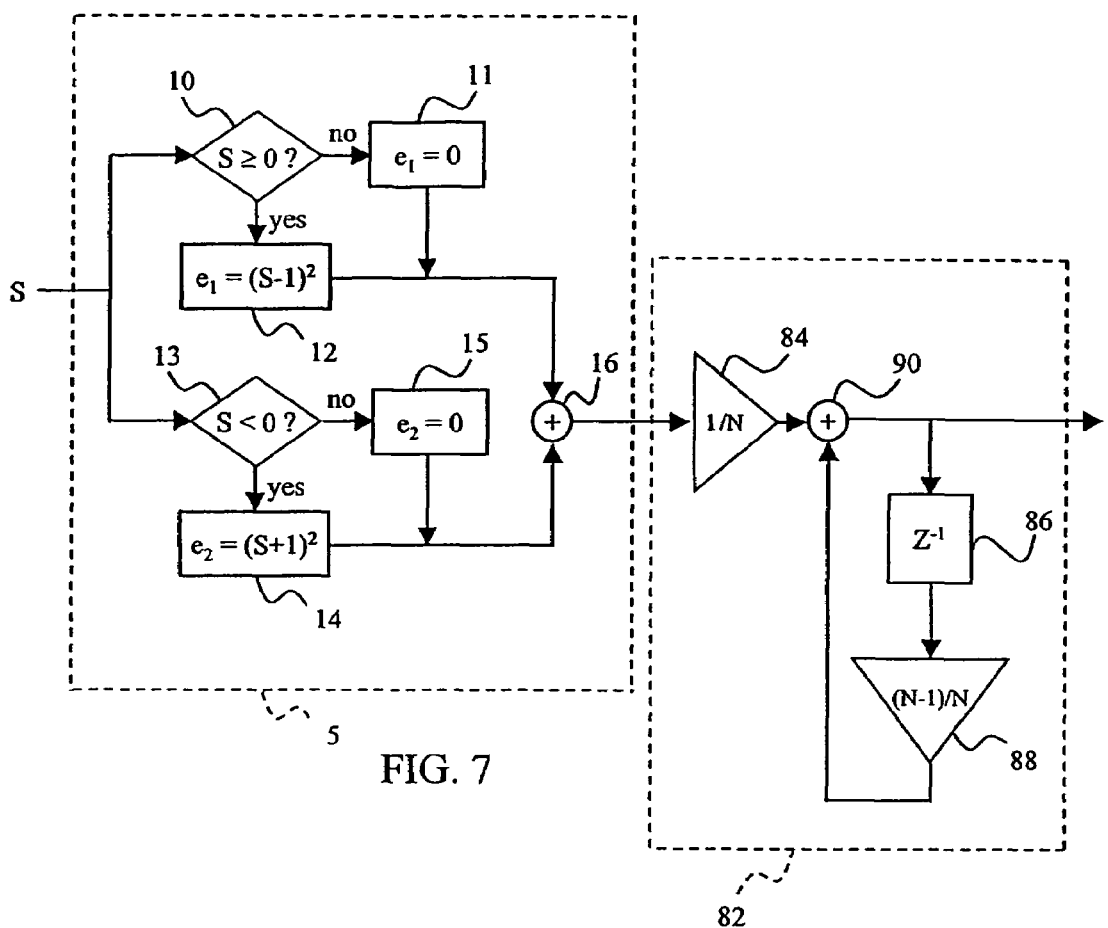
FIG. 7 depicts schematically a noise estimation module used by the noise evaluation device of the present invention, in a particular embodiment.

FIG. 7 depicts schematically a noise estimation module like the modules 21, 23 and 25 in FIG. 4 and the modules 41, 42 and 44 in FIG. 5, in a particular embodiment.

The noise estimator considered here applies to NRZ symbols, that is to say ones belonging to the set {−1; +1}. However, this is a non-limitative example and constellation symbols with two dimensions could also be considered.

It has a discriminating module 5 and a module 82 for calculating a moving average.

The discriminating module 5 receives as an input a noisy signal S and compares it with 0 (see the reference numbers 10 and 13 in FIG. 7) in order to determine to which Voronoï region it belongs.

It should be stated that the Voronoï regions of a constellation are planes delimited by the axes of symmetry of the constellation, and that they define the decision regions for reception: a point received is estimated by means of the closest point in the constellation, for example in the sense of the Euclidian distance, which amounts to estimating, by means of a given point in the constellation, all the points received which are in the same Voronoï region as this point in the constellation. In NRZ modulation, the Voronoï regions are two half-lines delimited by the point 0.

If the result of the comparison 10 is false, the variable $e_1$ designating the Euclidian distance is zero (reference 11). Otherwise the discriminator 5 calculates this Euclidian distance squared $e_1=(S-1)^2$ corresponding to the maximum likelihood criterion (reference 12).

Likewise, the discriminator 5 has means adapted to compare the noisy symbol received with 0 in order to determine whether it belongs to the other Voronoï region (reference 13). If the result of this comparison is false, the variable $e_2$ designating the Euclidian distance is zero (reference 15). If not, the discriminator 5 calculates this Euclidian distance squared $e^2(S+1)^2$ corresponding to the maximum likelihood criterion (reference 14).

The process of enumerating the Voronoï regions which has just been described can easily be extended to modulation modes different from NRZ modulation.

An adder 16 adds the results corresponding to the different Voronoï regions, which makes it possible to obtain the Euclidian distance from the symbol received to the closest theoretical point.

Next the module 82 calculates the moving average of the sum of these Euclidian distances. For this purpose, an amplifier 84 applies a gain of 1/N to the result issuing from the discriminator 5, N being the number of data items in each block processed by the noise estimator.

The result obtained is stored by means of a module 86 which applies a delay corresponding to the period between two successive data items, and then this result is amplified by an amplifier 88 which applies a gain of (N−1)/N.

An adder 90 adds the results issuing from the amplifiers 84 and 88.

Figure 6:
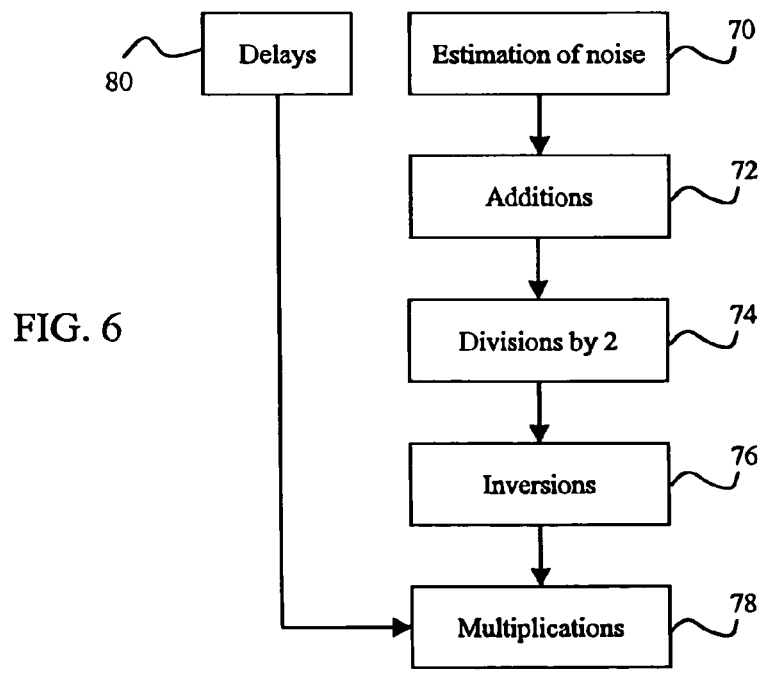
FIG. 6 is a flow diagram illustrating the main steps of the noise evaluation method according to the invention, in a particular embodiment.

The flow diagram of FIG. 6 illustrates the steps of the noise evaluation method according to the invention, in a particular embodiment.

First of all a noise estimation operation 70 is performed, during which there is determined an estimate of the noise related to each output of the turbo-encoder, namely the systematic output, the first-parity output and the second-parity output in the case of a two-parity turbo-encoder. This operation can be performed by means of three noise estimators like the one which has just been described in relation to FIG. 7.

Then, during a step 70, additions in pairs of the noise estimations are effected: the estimate of the noise related to the systematic output of the turbo-encoder and the estimate of the noise related to the data stream issuing from the first recursive systematic convolutional encoder included in the turbo-encoder are added, and the estimate of the noise related to the systematic output of the turbo-encoder and the estimate of the noise related to the data stream issuing from the second recursive systematic convolutional encoder included in the turbo-encoder are added.

Next, during a step 74, the result of each of the additions effected at step 72 is divided by 2.

The following step 76 consists of inverting the result of each of the previous divisions, so as to determine first and second normalisation factors or noise factors. This step 76 can form, with step 74, one and the same step.

Then a step 78 consists of applying the noise factors to the different data streams before input into the turbo-encoder:

a first multiplication operation consists of multiplying the data stream issuing from the first encoder by the first noise factor, calculated from the systematic and first-parity outputs;

a second multiplication operation consists of multiplying the data stream issuing from the systematic output and intended for the first elementary decoder included in the turbodecoder by the first noise factor;

a third multiplication operation consists of multiplying the data stream issuing from the second encoder by the second noise factor, calculated from the systematic and second-parity outputs; and a fourth multiplication operation consists of multiplying the data stream issuing from the systematic output and intended for the second elementary decoder included in the turbodecoder by the second noise factor.

In parallel to the noise estimation operation 70, the noise evaluation method includes a delay application operation 80, consisting of applying a delay to the data streams issuing from the three outputs of the turbo-encoder, prior to the multiplication operations of step 78; this makes it possible to terminate the calculation of the noise estimates before taking these into account for the turbodecoding.

Figure 8:
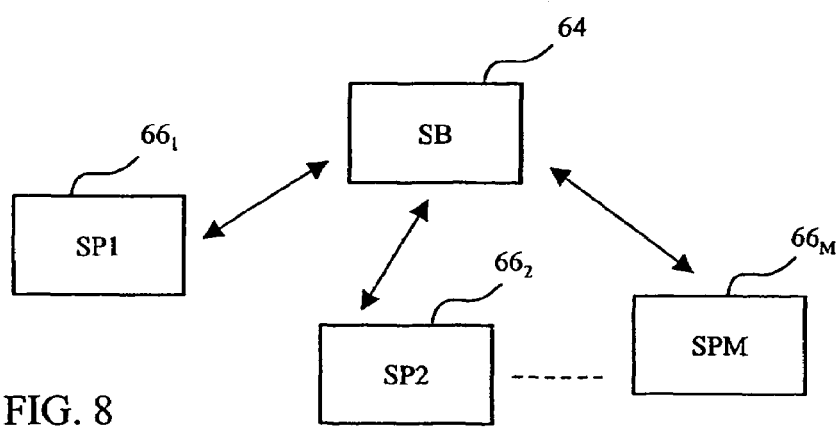
FIG. 8 is a simplified schematic view of a wireless telecommunications network, for example of the type in accordance with the Hyperlan II or UMTS-3GPP standard, able to implement the invention.

As shown in FIG. 8, a network according to the invention consists of a so-called base station SB designated by the reference 64, and several peripheral stations SPi, i=1, . . . , M, M being an integer greater than or equal to 1, respectively designated by the references $66_1, 66_2, \ldots, 66_M$. The peripheral stations $66_1, 66_2, \ldots, 66_M$ are remote from the base station SB, each connected by a radio link with the base station SB and able to move with respect to the latter.

Figure 9:
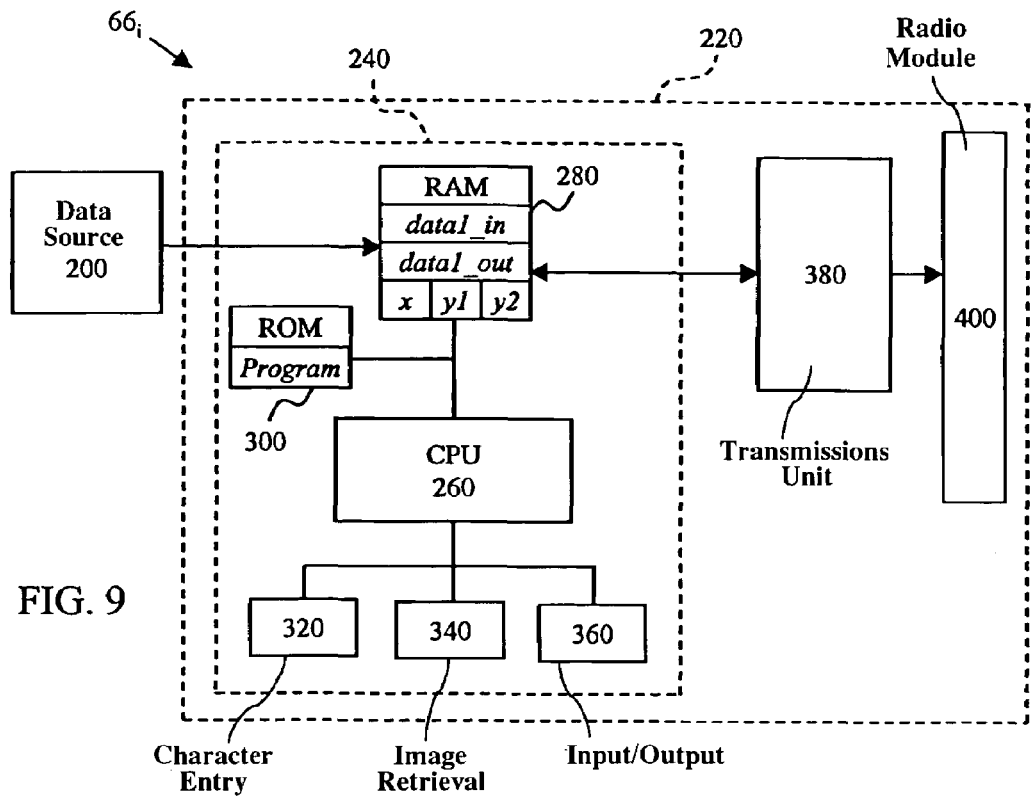
FIG. 9 is a schematic representation of a peripheral station in a network like the one in FIG. 8, used for transmission and able to implement the invention.

The block diagram of FIG. 9 depicts a more detailed view of a peripheral station SPi, i=1, . . . , M according to the invention which comprises a data source 200 and a transmission device 220.

The peripheral station SPi has, for example, a digital camera, a computer, a printer, a server, a facsimile machine, a scanner or a digital photographic apparatus.

The transmission device 220 comprises a data processing unit 240 comprising a calculation unit CPU ("Central Processing Unit") 260, a temporary data storage means 280 (RAM memory), a data storage means 300 (ROM memory), character entry means 320, such as a keyboard for example, image retrieval means 340 such as a screen for example, and input/output means 360.

The RAM 280 contains, in different registers:

input data "data1_in", coming from the data source 200;

output data "data1_out", obtained at the end of the unfolding of the noise evaluation method of the invention; and the current elements of the series of bits x, y1, y2 coming from the turbo-encoder.

The peripheral station SPi also comprises a transmission unit 380 and a radio module 400 including a known transmitter with one or more modulators, filters and a radio antenna (not shown).

The transmission device 220, by virtue of the program "Program", which is stored in ROM 300 and whose sequence of instructions corresponds to the steps of the noise evaluation method of the invention, is able to execute the steps of the noise evaluation method illustrated in FIG. 6.

Figure 10:
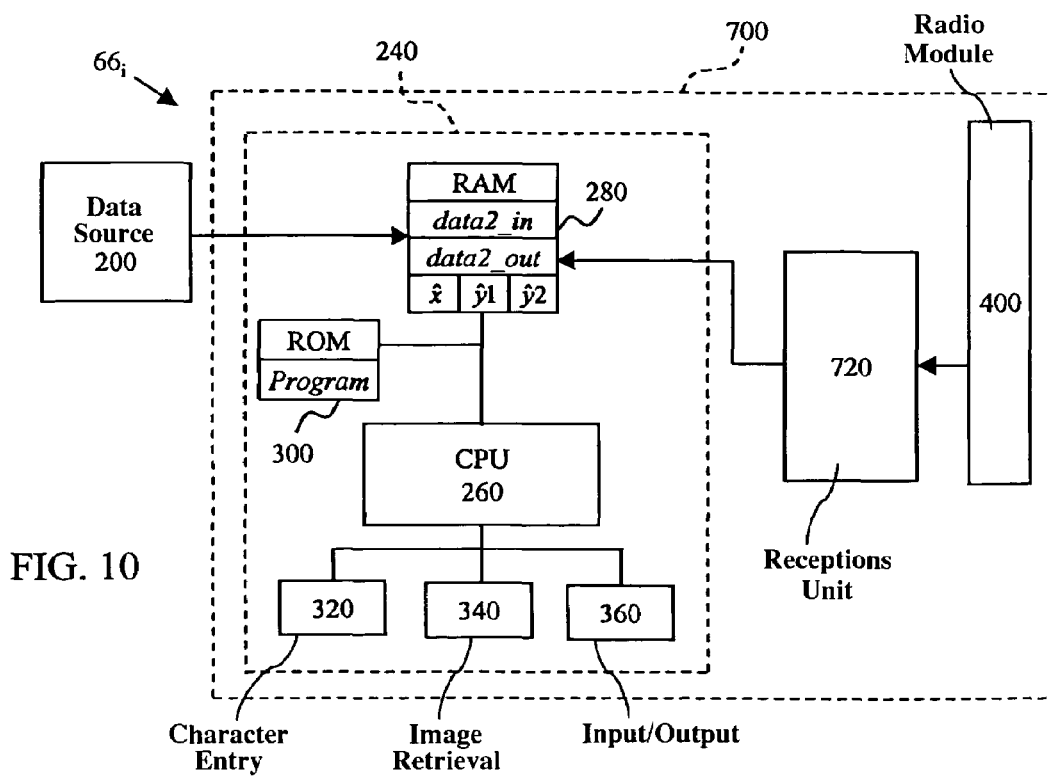
FIG. 10 is a schematic representation of a peripheral station in a network like the one in FIG. 8, used for reception and able to implement the invention.

The peripheral station SPi according to the invention also comprises, as shown in FIG. 10, a reception device 700 which consists of a data processing unit corresponding to the data processing unit 240 already described with reference to FIG. 9, a reception unit 720 and a radio module 400 with its antenna as depicted in FIG. 9.

In the reception device 700, the RAM 280 contains, in different registers:

input data "data2_in", coming from the turbo-encoder, after passing through a transmission channel;

output data $\hat{x}, \hat{y}1, \hat{y}2$, obtained at the end of the unfolding of the noise evaluation method of the invention; and the data "data2_out" obtained after decoding.

The reception device 700, by virtue of the program "Program" stored in ROM 300 and whose sequence of instructions corresponds to the steps of the noise evaluation method of the invention, is able to execute the steps of the noise evaluation method illustrated in FIG. 6.

The decoder can be produced so as to be hard-wired and placed in the reception device upstream of the reception unit 720 and downstream of the data processing unit 240.

The present invention, although described previously in this application to a two-parity turbo-encoder system, applies just as well to turbocode systems with more than two parities.

The invention applies easily to systems using quadrature amplitude modulations (QAM), with the exception of the modulation where the QAM symbol is used for transporting conjointly the systematic symbols and all the parity symbols, since in this case the noise statistics give the same results at all the outputs.

The invention also applies easily to systems using an Orthogonal Frequency Division Multiplex (OFDM).

The invention is independent of the type of modulation used.

The invention claimed is:

1. A method of removing noise from data streams encoded by a turbo-encoder having at least first and second encoders, the method comprising:

a noise estimation step, of estimating at least two of a noise related to a systematic output of the turbo-encoder, a noise related to a data stream issuing from the first encoder, and a noise related to a data stream issuing from the second encoder;

a noise determination step, of determining an estimate of noise on the basis of the at least two noises estimated in said noise estimation step; and a modification step, of modifying a data stream issuing from at least one of the first encoder, the second encoder, and the systematic output based upon the noise determined in said noise determination step.

2. The method according to claim 1, wherein said noise determination step includes determining an average of the at least two noises as an estimate of the noise.

3. The method according to claim 1, wherein said modification step includes multiplying an inverse of the estimate of the noise with the data streams issuing from at least one of the first encoder, the second encoders and the systematic output.

4. The method according to claim 1, wherein said noise estimation step includes estimating each of the noise related to the systematic output of the turbo-encoder, the noise related to the data stream issuing from the first encoder, and the noise related to the data stream issuing from the second encoder.

5. The method according to claim 4, wherein said noise determination step includes determining the estimate of the noise on the basis of the three noises estimated in said noise estimation step, and said modification step includes modifying the data streams issuing from the first encoder, the second encoder, and the systematic output based upon the estimate of the noise.

6. The method according to claim 4, wherein said noise determination step includes determining at least two noise estimates each on the basis of different pairs from among the three noises estimated in said noise estimation step, and said modification step includes modifying the data streams issuing from at least two of the first encoder, the second encoder, and the systematic output, based upon respective ones of the at least two noises determined in said noise determination step.

7. The method according to claim 1, further comprising a decoding step of decoding the data stream modified in said modification step.

8. A data processing apparatus for processing data streams encoded by a turbo-encoder having at least first and second encoders, the apparatus comprising:

noise estimation means for estimating at least two of a noise related to a systematic output of the turbo-encoder, a noise related to a data stream issuing from the first encoder, and a noise related to a data stream issuing from the second encoder;

noise determination means for determining an estimate of noise on the basis of the at least two noises estimated by said noise estimation means; and modification means for modifying a data stream issuing from at least one of the first encoder, the second encoder, and the systematic output, based upon the noise determined by the noise determination means.

9. A computer-readable program stored in a computer-readable storage medium that, when executed upon a computer processor, controls a computer to perform the method according to claim 1.

* * * * *

UNITED STATES PATENT AND TRADEMARK OFFICE
CERTIFICATE OF CORRECTION

PATENT NO. : 7,424,070 B2
APPLICATION NO. : 11/116324
DATED : September 9, 2008
INVENTOR(S) : Philippe A. Le Bars et al.

It is certified that error appears in the above-identified patent and that said Letters Patent is hereby corrected as shown below:

ON COVER PAGE AT (56) OTHER PUBLICATIONS

"US, US," should read --US,--.

COLUMN 2

Line 19, "ah" should read --an--.

COLUMN 3

Line 14, "estimate" should read --estimates--.

COLUMN 4

Line 66, "estimate" should read --estimates--.

COLUMN 8

Line 26, "$e^2 (S+1)^2$" should read --$e_2 = (S + 1)^2$--.

COLUMN 10

Line 59, "noise" should read --noises--.

Signed and Sealed this

Fifth Day of May, 2009

JOHN DOLL
*Acting Director of the United States Patent and Trademark Office*